(12) United States Patent
Khan I et al.

(10) Patent No.: US 12,144,155 B2
(45) Date of Patent: Nov. 12, 2024

(54) DATACENTER TEMPERATURE CONTROL AND MANAGEMENT

(71) Applicant: INTERNATIONAL BUSINESS MACHINES CORPORATION, Armonk, NY (US)

(72) Inventors: Afroz Khan I, Davanagere (IN); Hariharan Krishna, Bangalore (IN); Hemant Kumar Sivaswamy, Pune (IN); Devarajan Raman Karalil, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 214 days.

(21) Appl. No.: 17/816,046

(22) Filed: Jul. 29, 2022

(65) Prior Publication Data

US 2024/0040753 A1    Feb. 1, 2024

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01)

(58) Field of Classification Search
CPC ...... G06F 1/206; G06F 9/5094; G06F 1/3203; G06F 2201/86; G06F 2209/501;
(Continued)

(56) References Cited

U.S. PATENT DOCUMENTS 8,346,398 B2    1/2013   Ahmed
9,146,814 B1 *  9/2015   van der Merwe .. G06F 11/3058
(Continued)

FOREIGN PATENT DOCUMENTS

EP    3525563 A1    8/2019

OTHER PUBLICATIONS

"What To Do When Your Server Room Cooling Fails", EasyBreezy AC, last modified on Apr. 29, 2022, 2 pages, <https://www.easybreezyac.com/what-to-do-when-your-server-room-cooling-fails/>.
(Continued)

*Primary Examiner* — Darrin D Dunn
(74) *Attorney, Agent, or Firm* — Caleb D. Wilkes

(57) ABSTRACT

Systems, methods and/or computer program products for managing the temperature of datacenter during a period of malfunction or inoperability of the cooling system responsible for maintaining temperatures within the datacenter. Temperatures of the datacenter's computing systems are monitored by thermal imaging systems and/or sensors. Computing systems are also monitored for how frequently the systems are accessed during a defined period of time and the number of mission critical deployments by each computing system. Collected parameters, including temperature, frequency of access and number of running mission critical applications are imputed into a scoring algorithm which uses the collected parameters and weightings to generate a ranking of computing systems to shutdown sequentially in response to rising temperatures. As temperatures rise above a target temperature, computing systems with the highest score (and the lowest amount of risk) are shutdown, lowering the temperature of the datacenter until the cooling system becomes operation again.

20 Claims, 9 Drawing Sheets

(58) Field of Classification Search
CPC ............ G06F 11/3612; H05K 7/20836; H05K 7/1498; G05B 13/02; G06N 20/00; G06N 3/08
See application file for complete search history.

(56) References Cited

U.S. PATENT DOCUMENTS

| | | | |
|---|---|---|---|
| 9,538,690 B2 | 1/2017 | Dasari | |
| 9,594,721 B1 | 3/2017 | Marr | |
| 9,778,718 B2 | 10/2017 | Zacho | |
| 11,237,868 B2* | 2/2022 | Manousakis | G06F 9/5077 |
| 2012/0137289 A1* | 5/2012 | Nolterieke | G06F 9/5094 |
| | | | 718/1 |
| 2014/0031956 A1 | 1/2014 | Slessman | |
| 2014/0052429 A1 | 2/2014 | Kelkar | |
| 2014/0136870 A1* | 5/2014 | Breternitz | G06F 1/3225 |
| | | | 713/323 |
| 2018/0039717 A1* | 2/2018 | Bak | G06F 30/20 |
| 2019/0243685 A1 | 8/2019 | Guim Bernat | |
| 2021/0120014 A1* | 4/2021 | Argoety | G06F 21/552 |
| 2022/0058103 A1* | 2/2022 | Orndorf | G06F 11/3495 |
| 2022/0164242 A1* | 5/2022 | Sui | G06F 9/505 |
| 2022/0365859 A1* | 11/2022 | Borkar | G06F 3/1454 |
| 2022/0398515 A1* | 12/2022 | McGuire | G06F 11/3428 |
| 2023/0017632 A1* | 1/2023 | Herb | G06F 11/3058 |
| 2023/0118854 A1* | 4/2023 | Katari | G06F 11/3457 |
| | | | 714/57 |

OTHER PUBLICATIONS

Abbasi et al., "Thermal Aware Server Provisioning And Workload Distribution For Internet Data Centers", HPDC '10, Jun. 20-25, 2010, Chicago, Illinois, USA, pp. 130-141.

Mell et al., "The NIST Definition of Cloud Computing", Recommendations of the National Institute of Standards and Technology, Special Publication 800-145, Sep. 2011, 7 pages.

Mukherjee et al., "Spatio-temporal thermal-aware job scheduling to minimize energy consumption in virtualized heterogeneous data centers", Computer Networks 53 (2009), Available online Jun. 30, 2009, pp. 2888-2904.

Pakbaznia et al., "Minimizing Data Center Cooling and Server Power Costs", ISLPED '09, Aug. 19-21, 2009, San Francisco, California, USA, pp. 145-150.

Wurtz, Brad, "Preparing Data Centers Power & Cooling For The Next Natural Disaster", Mission Critical, Apr. 2, 2012, 6 pages, <https://www.missioncriticalmagazine.com/articles/84820-preparing-data-centers-power—cooling-for-the-next-natural-disaster>.

Zhang et al., "Towards Joint Optimization Over ICT and Cooling Systems in Data Centre: A Survey", IEEE Communication Surveys & Tutorials, USA, Mar. 22, 2016, 22 pages.

Zhou et al., "Failure Resistant Data Center Cooling Control Through Model-Based Thermal Zone Mapping", Proceedings of ASME 2012 Summer Heat Transfer Conference, HT2012, Jul. 8-12, 2012, Puerto Rico, USA, 8 pages.

* cited by examiner

WEIGHTINGS TABLE — 701

| TYPE | RANGE | | | WEIGHTS | | |
|---|---|---|---|---|---|---|
| TEMPERATURE | 0-20 | | 20-28 | | 28 + | |
| | | 5 | | 2 | | 1 |
| FREQUENCY OF ACCESS | 100 | | > 100 & < 500 | | > 500 | |
| | | 4 | | 2 | | 1 |
| MISSION CRITICAL APPLICATION HOSTED | 0 | | < 5 | | > 5 | |
| | | 3 | | 2 | | 1 |

FIG. 7A

RISK ASSESSMENT CLASSIFICATION TABLE

| SCORE | RISK ASSESSMENT |
|---|---|
| >8 | LOW |
| 4-7 | MEDIUM |
| <3 | HIGH |

SCORING ALGORITHM OUTPUT TABLE

| RACK AND BLADE | FINAL SCORE |
|---|---|
| R20B2 | 9 |
| R20B3 | 7 |
| R20B0 | 3 |
| R20B1 | 2 |

DATACENTER TEMPERATURE CONTROL AND MANAGEMENT

BACKGROUND

The present disclosure relates generally to the field of datacenter management, and more specifically to managing temperature conditions within the datacenter and prioritization of computing systems in the event a datacenter's cooling systems are malfunction or experience errors.

Datacenter cooling technology maintains environmental conditions suitable for maintaining computing equipment in a healthy state of operation. Achieving this goal often requires removing the heat produced by the computing equipment within the datacenter and transferring that heat to a heat sink. In most datacenters, the operators expect the cooling system to operate continuously and reliably. For decades, computer rooms and datacenters have utilized raised floor systems to deliver cold air to servers and other types of equipment within the datacenter. Cooling systems often rely on delivering a relatively small quantity of conditioned air and letting that small volume of conditioned air mix with the larger volume of air within the datacenter to reach a desired temperature. Cold air from a computer room air conditioner (CRAC) or computer room air handler (CRAH) pressurizes the space below a raised floor. Perforated tiles provided an avenue for the cold air to enter the main space where the computer equipment is held, and ideally in front of the intakes of the computing equipment. After passing through the computing equipment, the heated air returns to the CRAC or CRAH to be cooled, usually after mixing with the cold air. Very often, the CRAC unit's return temperature is a set point used to control the cooling system's operation. Most commonly the CRAC unit fans run at a constant speed, and the CRAC may have a humidifier within the unit, producing steam. The primary benefit of a raised floor, from a cooling standpoint, is to deliver cold air where it is needed, with very little effort, by simply swapping a solid tile for a perforated tile.

SUMMARY

Embodiments of the present disclosure relate to a computer-implemented method, an associated computer system and computer program products for managing temperatures of a datacenter. The computer-implemented method comprises collecting, by a processor, thermal imaging data from at least one thermal imaging system monitoring temperatures of at least one hardware unit of the datacenter; monitoring, by the processor, network resource of each of the at least one hardware unit for information indicating frequency of access for each of the at least one hardware unit over a selected period of time; obtaining, by the processor, a number of deployments running on each of the at least one hardware unit that are mission critical applications; calculating, by the processor, a weighted score for each of the at least one hardware unit based on a combination of the thermal imaging data, the frequency of access and the number of deployments that are mission critical applications; ordering, by the processor, the weighted scores into a list from lowest risk assessment to highest risk assessment for the at least one hardware unit; and upon detecting, by the processor, the temperatures within the datacenter arising above a target temperature, automatically shutting down a hardware unit with the weighted score that indicates the lowest risk assessment on the list.

BRIEF DESCRIPTION OF THE DRAWINGS

The drawings included in the present disclosure are incorporated into, and form part of, the specification. The drawings illustrate embodiments of the present disclosure and, along with the description, explain the principles of the disclosure. The drawings are only illustrative of certain embodiments and do not limit the disclosure.

FIG. 7A depicts an embodiment of a table comprising relative weightings utilized by a scoring algorithm for calculating and generating an ordered list of hardware units within a datacenter for sequential shutdown in response to a malfunction or inoperability of a cooling system.

FIG. 7B depicts an embodiment of a table describing scoring outputs provided from the table of FIG. 8A and an associated risk assessment of a hardware unit assigned the corresponding score.

FIG. 7C depicts an example of an embodiment of an ordered list outputted from a scoring algorithm comprising a plurality server blades of a server rack arranged in an order to be sequentially shutdown in the event of a cooling system malfunction or period of inoperability, to control temperatures within a datacenter, in accordance with the present disclosure.

DETAILED DESCRIPTION

Figure 1:
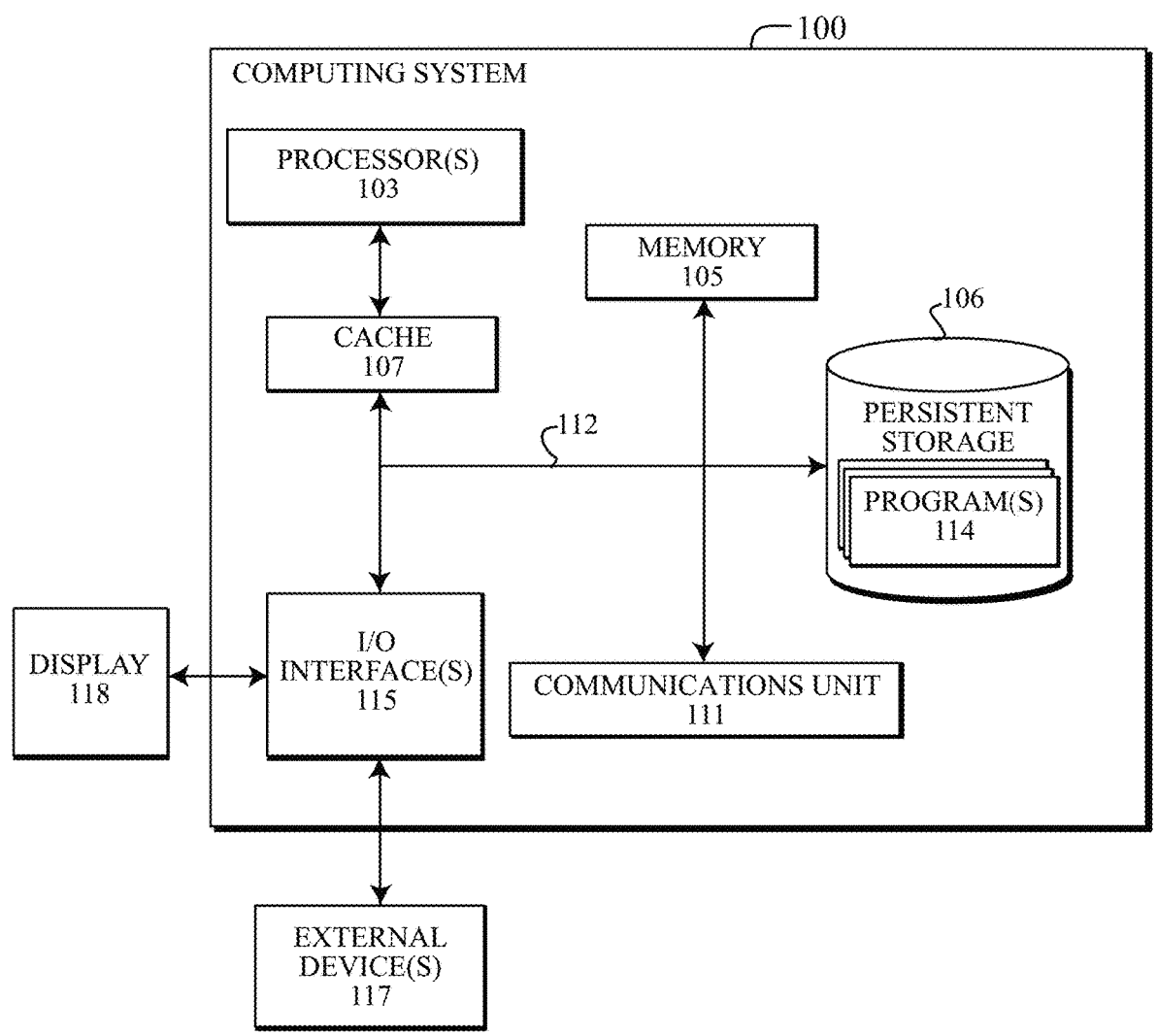
FIG. 1 depicts a block diagram illustrating an embodiment of a computing system and the internal and external components thereof, upon which embodiments described herein may be implemented in accordance with the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The corresponding structures, materials, acts, and equivalents of all means or steps plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiments chosen and described are in order to best explain the principles of the disclosure, the practical applications and to enable others of ordinary skill in the art to understand the disclosure for various embodiments with various modifications as are suited to the particular use contemplated.

Overview

A Cloud data center can be described as a location where devices used for cloud computing are installed and reside. A typical datacenter might be equipped with several computing systems, along with a plethora of storage devices, network cables and other components utilized during the operation of the datacenter to deliver applications and services to user accessing the datacenter. During operation, a datacenter can produce large amounts of heat due to computer systems running non-stop around the clock. Cooling the equipment within the datacenter can be very important for maintaining the computers in a healthy state to ensure that the computing equipment continues to run properly and at an optimal level. If one of the datacenters goes down, such an outage can severely impact businesses hosted on the cloud and therefore becomes imperative that the datacenter is up and running at all times.

In order to keep the temperature within the datacenter maintained at a safe level for the computing systems and other hardware, the datacenter can be cooled from the floors using fans to circulate cold air. If cooling systems within the datacenter go offline, become inoperative or fail for any reason for a period of time, temperatures within the datacenter can rise dramatically due to the excessive amounts of heat outputted by the computing equipment. Embodiments of the present disclosure recognize that as temperatures rise due to a non-functioning cooling system, excessive amounts of heat can cause damage to the computing systems, including storage devices and servers. Accordingly, there is a need for systems, methods and program products that are able to reduce temperatures within a datacenter when the cooling system is unusable, while still maintaining a balance that prioritizes continued operation of computing systems that are most frequently used, computing systems running the most critical applications of the datacenter, and the computing systems that produce the largest amount of heat within the datacenter.

Embodiments of the present disclosure solve the problems associated with excess heat that may build up during emergency conditions within a datacenter while a cooling system has malfunctioned or becomes inoperable. Embodiments reduce the datacenter's temperature to an acceptable target temperature even in the absence of the cooling system's operation using a scoring algorithm to prioritize the shutdown of hardware units within the datacenter based on: a combination of the amount of heat outputted by each hardware unit, as measured by thermal imaging cameras and/or sensors; how frequently each hardware unit is accessed by users; and the number of mission critical applications hosted by each hardware unit. The scoring algorithm weights each parameter being considered and outputs a final score for each hardware unit. An ordered list or hierarchical pyramid of the hardware units can be constructed, prescribing levels of prioritization or a sequence in which hardware units can be shut down within the datacenter in order to reduce the temperature of the datacenter. In the event of the cooling system malfunctioning or becoming inoperable, the datacenter can measure the overall or average temperature within the datacenter and if the temperature rises above a target temperature, the datacenter can begin sequentially shutting off hardware units in the order prescribed by the ordered list of hierarchy generated using the scoring algorithm until the datacenter's temperature falls below the target temperature and/or the cooling system becomes operational again.

Computing System

The present invention may be a system, a method, and/or a computer program product at any possible technical detail level of integration. The computer program product may include a computer-readable storage medium (or media) having the computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source code or object code written in any combination of one or more programming languages, including an object-oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer-readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other devices to cause a series of operational steps to be performed on the computer, other programmable apparatus, or other devices to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

FIG. 1 illustrates a block diagram describing an embodiment of a computing system 100, which may be a simplified example of a computing device (i.e., a physical bare metal system and/or a virtual system) capable of performing the computing operations described herein. Computing system 100 may be representative of the one or more computing systems or devices implemented in accordance with the embodiments of the present disclosure and further described below in detail. It should be appreciated that FIG. 1 provides only an illustration of one implementation of a computing system 100 and does not imply any limitations regarding the environments in which different embodiments may be implemented. In general, the components illustrated in FIG. 1 may be representative of any electronic device, either physical or virtualized, capable of executing machine-readable program instructions.

Although FIG. 1 shows one example of a computing system 100, a computing system 100 may take many different forms, including bare metal computer systems, virtualized computer systems, container-oriented architecture, microservice-oriented architecture, etc. For example, computing system 100 can take the form of a desktop computer system or workstation, laptops, notebooks, tablets, servers, client devices, network devices, network terminals, thin clients, thick clients, kiosks, mobile communication devices (e.g., smartphones), multiprocessor systems, microprocessor-based systems, minicomputer systems, mainframe computer systems, smart devices, and/or Internet of Things (IoT) devices. The computing systems 100 can operate in a local computing environment, networked computing environment, a containerized computing environment comprising one or more pods or clusters of containers, and/or a distributed cloud computing environment, which can include any of the systems or devices described herein and/or additional computing devices or systems known or used by a person of ordinary skill in the art.

Computing system 100 may include communications fabric 112, which can provide for electronic communications among one or more processor(s) 103, memory 105, persistent storage 106, cache 107, communications unit 111, and one or more input/output (I/O) interface(s) 115. Communications fabric 112 can be implemented with any architecture designed for passing data and/or controlling information between processor(s) 103 (such as microprocessors, CPUs, and network processors, etc.), memory 105, external devices 117, and any other hardware components within a computing system 100. For example, communications fabric 112 can be implemented as one or more buses, such as an address bus or data bus.

Memory 105 and persistent storage 106 may be computer-readable storage media. Embodiments of memory 105 may include random access memory (RAM) and/or cache 107 memory. In general, memory 105 can include any suitable volatile or non-volatile computer-readable storage media and may comprise firmware or other software programmed into the memory 105. Program(s) 114, application(s), processes, services, and installed components thereof, described herein, may be stored in memory 105 and/or persistent storage 106 for execution and/or access by one or more of the respective processor(s) 103 of the computing system 100.

Persistent storage 106 may include a plurality of magnetic hard disk drives, solid-state hard drives, semiconductor storage devices, read-only memories (ROM), erasable programmable read-only memories (EPROM), flash memories, or any other computer-readable storage media that is capable of storing program instructions or digital information. Embodiments of the media used by persistent storage 106 can also be removable. For example, a removable hard drive can be used for persistent storage 106. Other examples include optical and magnetic disks, thumb drives, and smart cards that are inserted into a drive for transfer onto another computer-readable storage medium that is also part of persistent storage 106.

Communications unit 111 provides for the facilitation of electronic communications between computing systems 100. For example, between one or more computer systems or devices via a communication network. In the exemplary embodiment, communications unit 111 may include network adapters or interfaces such as a TCP/IP adapter cards, wireless interface cards, or other wired or wireless communication links. Communication networks can comprise, for example, copper wires, optical fibers, wireless transmission, routers, load balancers, firewalls, switches, gateway computers, edge servers, and/or other network hardware which may be part of, or connect to, nodes of the communication networks including devices, host systems, terminals or other network computer systems. Software and data used to practice embodiments of the present disclosure can be downloaded to the computing systems 100 operating in a network environment through communications unit 111 (e.g., via the Internet, a local area network, or other wide area networks). From communications unit 111, the software and the data of program(s) 114 or application(s) can be loaded into persistent storage 106.

One or more I/O interfaces 115 may allow for input and output of data with other devices that may be connected to computing system 100. For example, I/O interface 115 can provide a connection to one or more external devices 117 such as one or more smart devices, IoT devices, recording systems such as camera systems or sensor device(s), input devices such as a keyboard, computer mouse, touch screen, virtual keyboard, touchpad, pointing device, or other human interface devices. External devices 117 can also include portable computer-readable storage media such as, for example, thumb drives, portable optical or magnetic disks, and memory cards. I/O interface 115 may connect to human-readable display 118. Human-readable display 118 provides a mechanism to display data to a user and can be, for example, computer monitors or screens. For example, by displaying data as part of a graphical user interface (GUI). Human-readable display 118 can also be an incorporated display and may function as a touch screen, such as a built-in display of a tablet computer.

Figure 2:
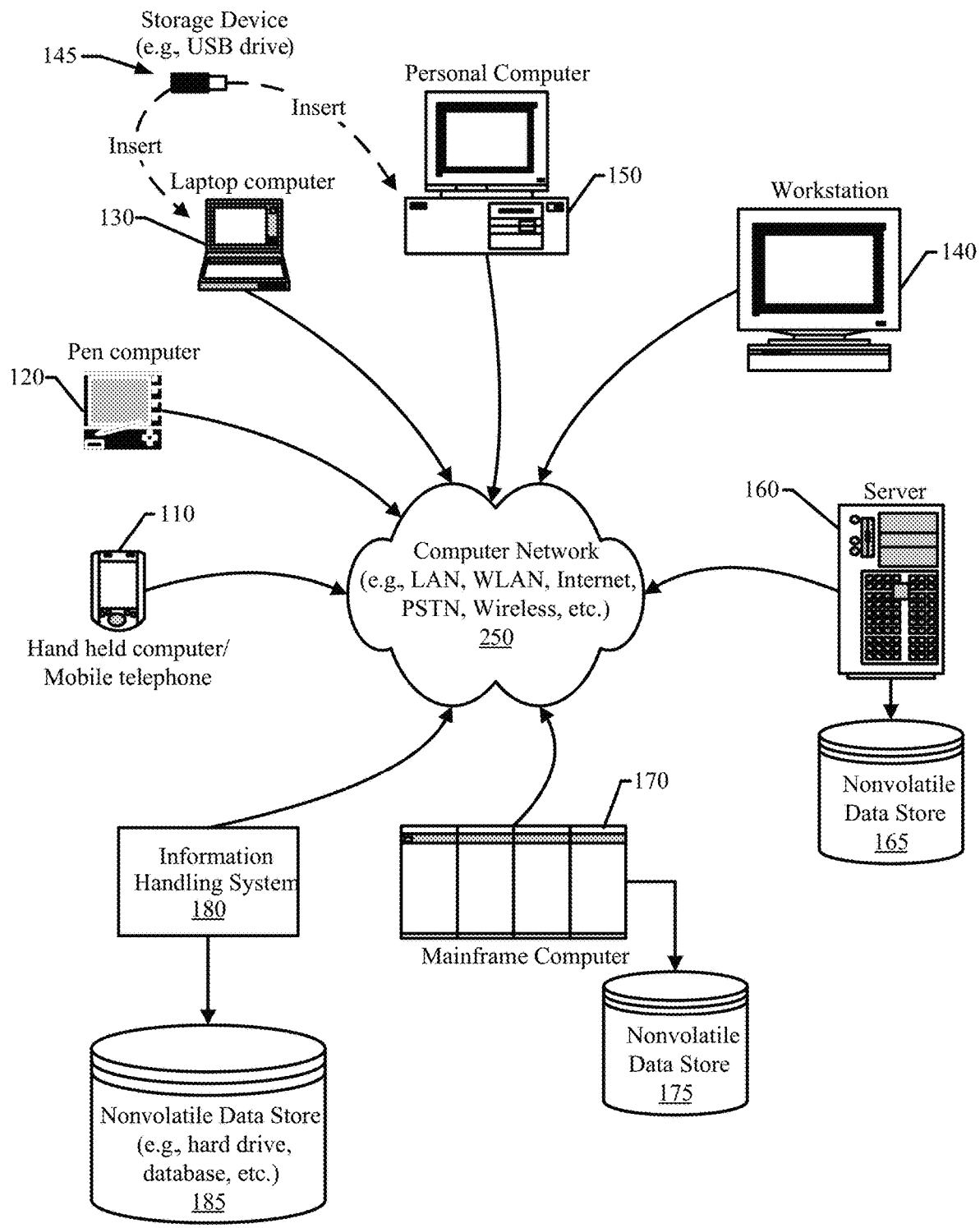
FIG. 2 depicts a block diagram illustrating an extension of the computing system environment of FIG. 1, wherein the computing systems are configured to operate in a network environment and perform methods described herein in accordance with the present disclosure.

FIG. 2 provides an extension of the computing system 100 environment shown in FIG. 1 to illustrate that the methods described herein can be performed on a wide variety of computing systems that operate in a networked environment. Types of computing systems 100 may range from small handheld devices, such as handheld computer/mobile telephone 110 to large mainframe systems, such as mainframe computer 170. Examples of handheld computer 110 include personal digital assistants (PDAs), personal entertainment devices, such as Moving Picture Experts Group Layer-3 Audio (MP3) players, portable televisions, and compact disc players. Other examples of information handling systems include pen, or tablet computer 120, laptop or notebook computer 130, workstation 140, personal computer system 150, and server 160. Other types of information handling systems that are not individually shown in FIG. 2 are represented by information handling system 180.

Many of the computing systems can include nonvolatile data stores, such as hard drives and/or nonvolatile memory. The embodiment of the information handling system shown in FIG. 2 includes separate nonvolatile data stores (more specifically, server 160 utilizes nonvolatile data store 165, mainframe computer 170 utilizes nonvolatile data store 175, and information handling system 180 utilizes nonvolatile data store 185). The nonvolatile data store can be a component that is external to the various computing systems or can be internal to one of the computing systems. In addition, removable nonvolatile storage device 145 can be shared among two or more computing systems using various techniques, such as connecting the removable nonvolatile storage device 145 to a USB port or other connector of the computing systems. In some embodiments, the network of computing systems 100 may utilize clustered computing and components acting as a single pool of seamless resources when accessed through network 250 by one or more computing systems. For example, such embodiments can be used in a datacenter, cloud computing network, storage area network (SAN), and network-attached storage (NAS) applications.

As shown, the various computing systems 100 can be networked together using computer network 250 (referred to herein as "network 250"). Types of networks 250 that can be used to interconnect the various information handling systems including Local Area Networks (LANs), Wireless Local Area Networks (WLANs), home area network (HAN), wide area network (WAN), backbone networks (BBN), peer to peer networks (P2P), campus networks, enterprise networks, the Internet, single tenant or multi-tenant cloud computing networks, the Public Switched Telephone Network (PSTN), and any other network or network topology known by a person skilled in the art to interconnect computing systems 100.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. A cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 3:
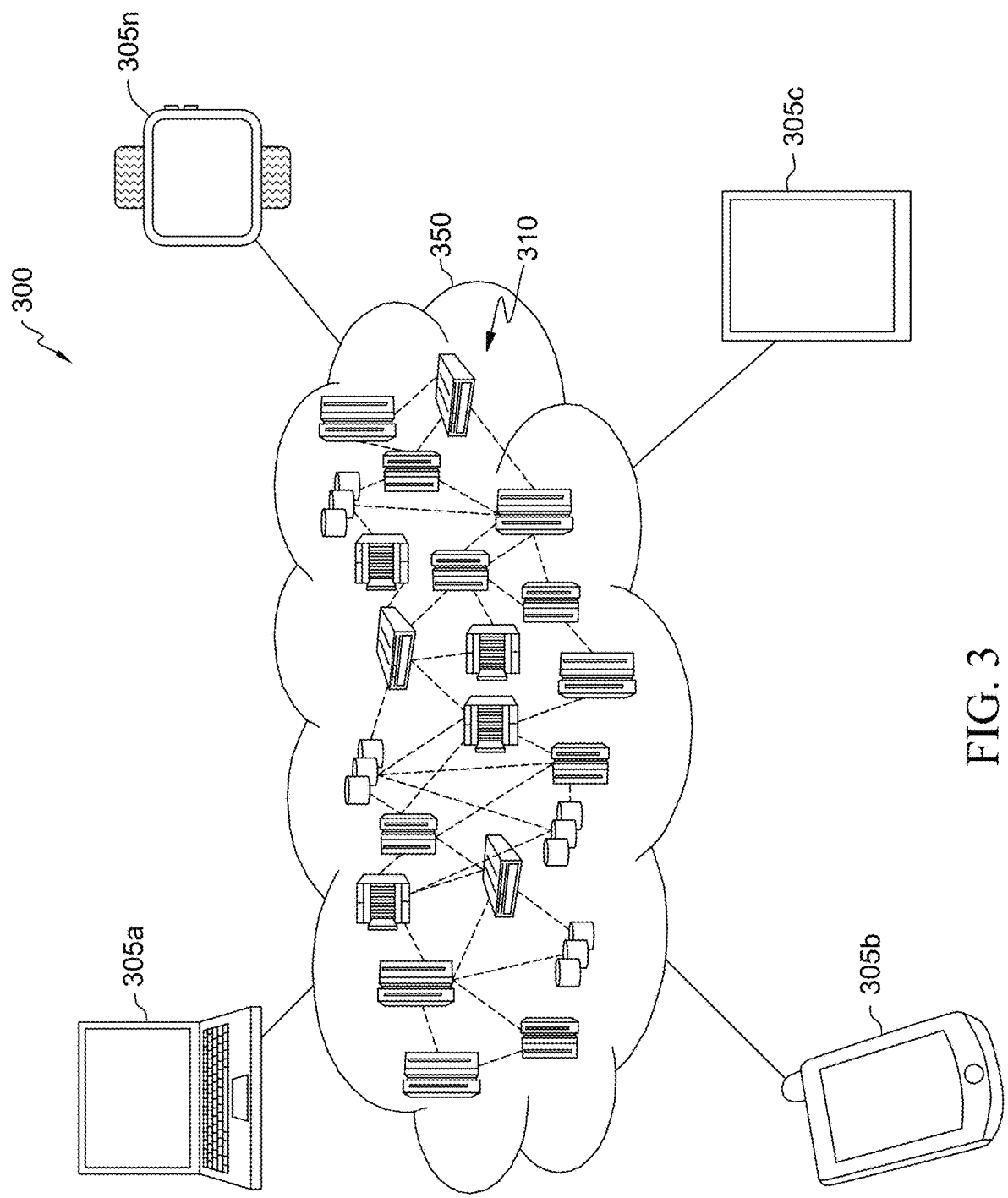
FIG. 3 depicts a block diagram illustrating a cloud computing environment in accordance with the present disclosure.

Referring to the drawings, FIG. 3 is an illustrative example of a cloud computing environment 300. As shown, cloud computing environment 300 includes a cloud network 350 comprising one or more cloud computing nodes 310 with which end user device(s) or client devices may be used by cloud consumers to access one or more software products, services, applications, and/or workloads provided by cloud service providers or tenants of the cloud network 350. Examples of the user device(s) 305 are depicted and may include devices such as a desktop computer, laptop computer 305a, smartphone 305b or cellular telephone, tablet computers 305c and smart devices such as a smartwatch 305n or smart glasses. Nodes 310 may communicate with one another and may be grouped (not shown) physically or virtually, in one or more networks, such as Private, Community, Public, or Hybrid clouds as described hereinabove, or a combination thereof. This allows cloud computing environment 300 to offer infrastructure, platforms and/or software as services for which a cloud consumer does not need to maintain resources on a local computing device. It is understood that the types of end user devices 305 shown in FIG. 3 are intended to be illustrative only and that computing nodes 310 of cloud computing environment 300 can communicate with any type of computerized device over any type of network and/or network addressable connection (e.g., using a web browser).

Figure 4:
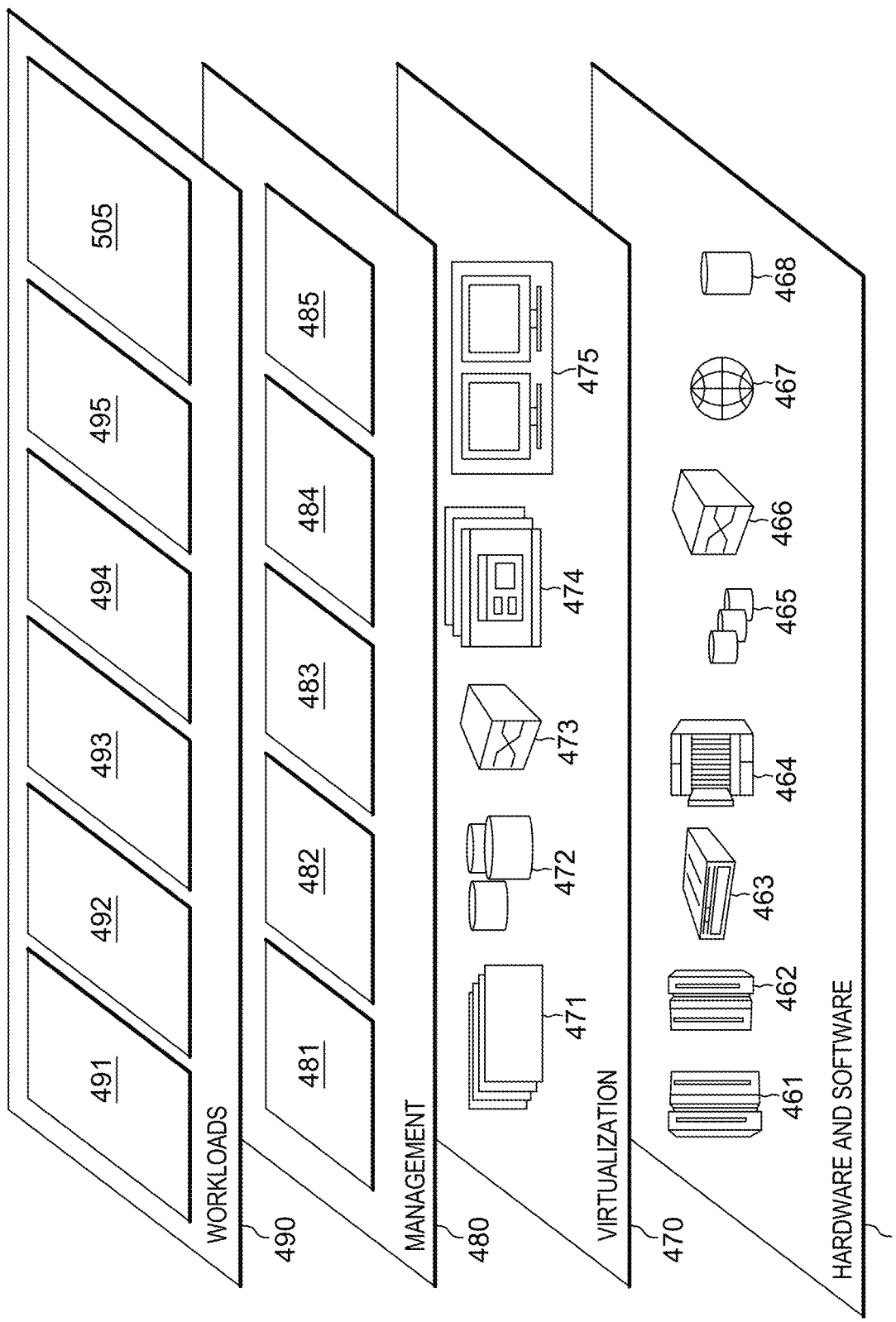
FIG. 4 depicts an embodiment of abstraction model layers of a cloud computing environment in accordance with the present disclosure.

Referring now to FIG. 4, a set of functional abstraction layers provided by cloud computing environment 300 is shown. It should be understood in advance that the components, layers, and functions shown in FIG. 4 are intended to be illustrative only and embodiments of the invention are not limited thereto. As depicted, the following layers and corresponding functions are provided:

Hardware and software layer 460 includes hardware and software components. Examples of hardware components include mainframes 461; RISC (Reduced Instruction Set Computer) architecture-based servers 462; servers 463; blade servers 464; storage devices 465; and networks and networking components 466. In some embodiments, software components include network application server software 467 and database software 468.

Virtualization layer 470 provides an abstraction layer from which the following examples of virtual entities may be provided: virtual servers 471; virtual storage 472; virtual networks 473, including virtual private networks; virtual applications and operating systems 474; and virtual clients 475.

Management layer 480 may provide the functions described below. Resource provisioning 481 provides dynamic procurement of computing resources and other resources that are utilized to perform tasks within the cloud computing environment 300. Metering and pricing 482 provide cost tracking as resources are utilized within the cloud computing environment 300, and billing or invoicing for consumption of these resources. In one example, these resources can include application software licenses. Security provides identity verification for cloud consumers and tasks, as well as protection for data and other resources. User portal 483 provides access to the cloud computing environment 300 for consumers and system administrators. Service level management 484 provides cloud computing resource allocation and management such that required service levels are met. Service Level Agreement (SLA) planning and fulfillment 485 provide pre-arrangement for, and procurement of, cloud computing resources for which a future requirement is anticipated in accordance with an SLA.

Workloads layer 490 provides examples of functionality for which the cloud computing environment may be utilized. Examples of workloads and functions which may be provided from this layer include software development and lifecycle management 491, data analytics processing 492, transaction processing 493, database management 494; video conferencing 495; and management of datacenter temperature controls, for example using temperature management module 505.

System for Managing Temperatures of a Datacenter

It will be readily understood that the instant components, as generally described and illustrated in the Figures herein, may be arranged and designed in a wide variety of different configurations. Accordingly, the following detailed description of the embodiments of at least one of a method, apparatus, non-transitory computer readable medium and system, as represented in the attached Figures, is not intended to limit the scope of the application as claimed but is merely representative of selected embodiments.

The instant features, structures, or characteristics as described throughout this specification may be combined or removed in any suitable manner in one or more embodiments. For example, the usage of the phrases "example embodiments," "some embodiments," or other similar language, throughout this specification refers to the fact that a particular feature, structure, or characteristic described in connection with the embodiment may be included in at least one embodiment. Accordingly, appearances of the phrases "example embodiments," "in some embodiments," "in other embodiments," or other similar language, throughout this specification do not necessarily all refer to the same group of embodiments, and the described features, structures, or characteristics may be combined or removed in any suitable manner in one or more embodiments. Further, in the Figures, any connection between elements can permit one-way and/or two-way communication even if the depicted connection is a one-way or two-way arrow. Also, any device depicted in the drawings can be a different device. For example, if a mobile device is shown sending information, a wired device could also be used to send the information.

Figure 5:
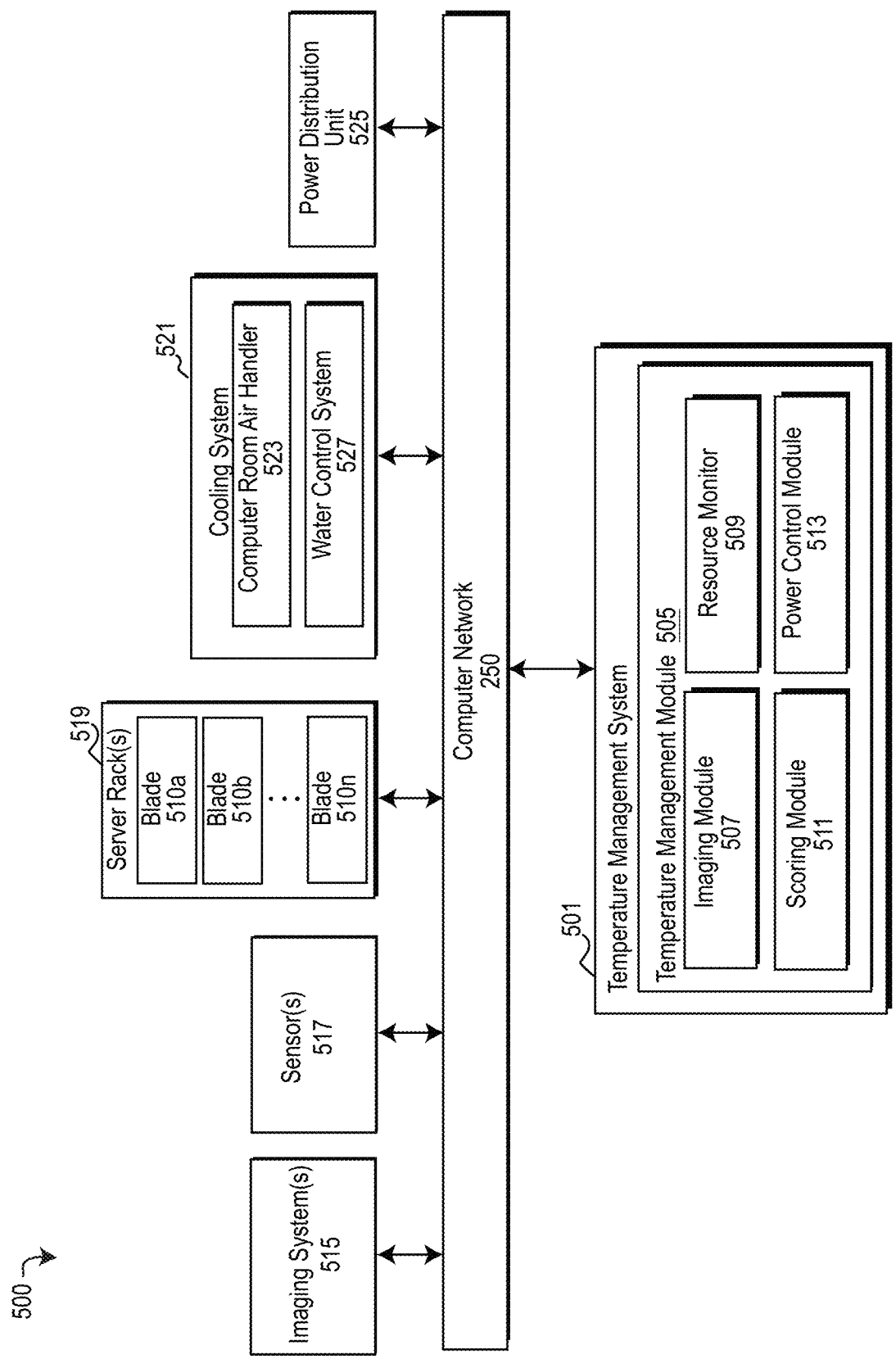
FIG. 5 depicts a functional block diagram describing an embodiment of a computing environment for managing the temperature of a datacenter, in accordance with the present disclosure.

Referring to the drawings, FIG. 5 depicts an embodiment of a computing environment 500 illustrating a system for managing temperature and climate conditions within a datacenter during period of time wherein one or more cooling systems 521 may malfunction, become non-operational or experiencing errors. As illustrated, the computing environment 500 may be comprised of a plurality of computing systems and/or components, which may communicate with one another through a computing network 250. The computing systems and components can include a temperature management system 501, imaging system(s) 515, sensor(s) 517, one or more hardware units such as server rack(s) 519 comprising one or more server blades 510a-510n, a cooling system 521, and/or a power distribution unit 525.

Figure 6A:
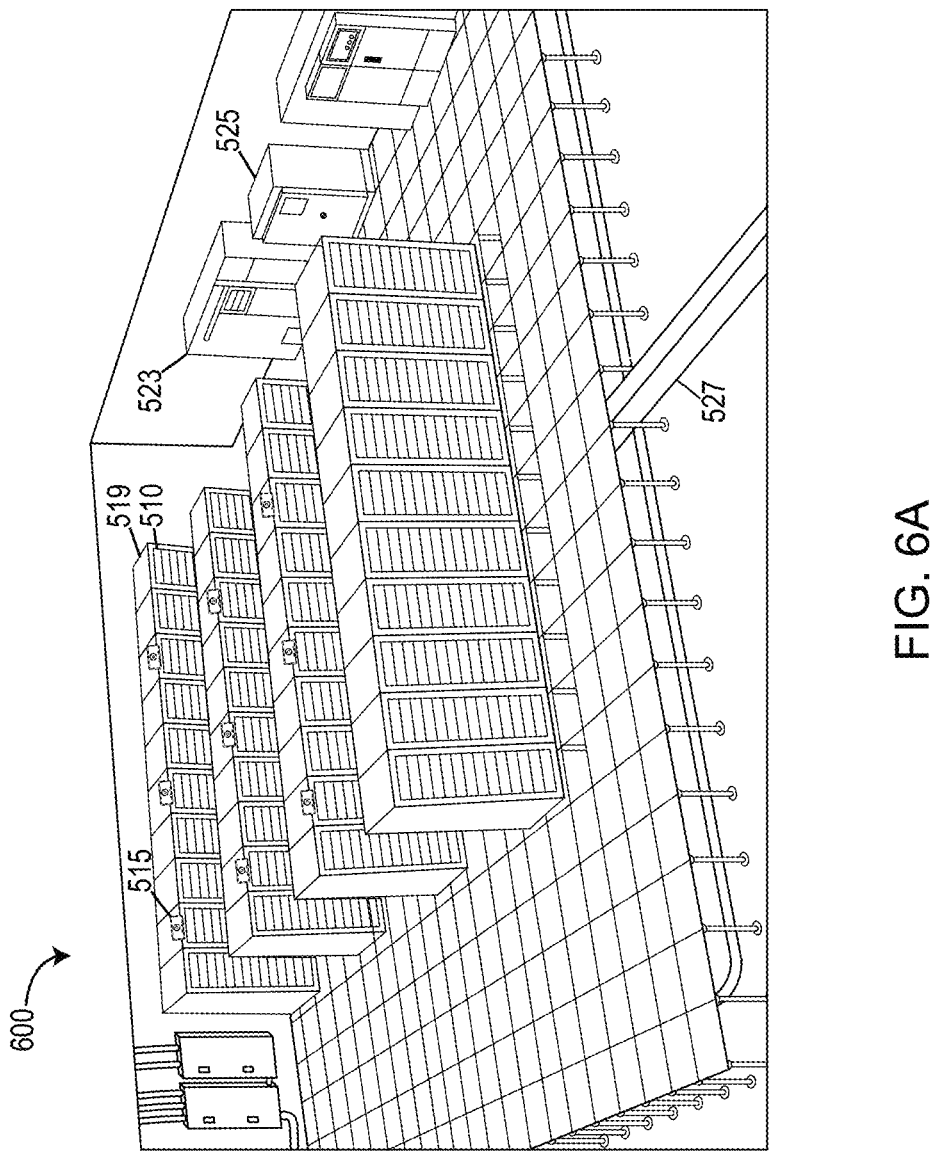
FIG. 6A illustrates an embodiment of a portion of a datacenter, in accordance with the present disclosure.
Figure 6B:
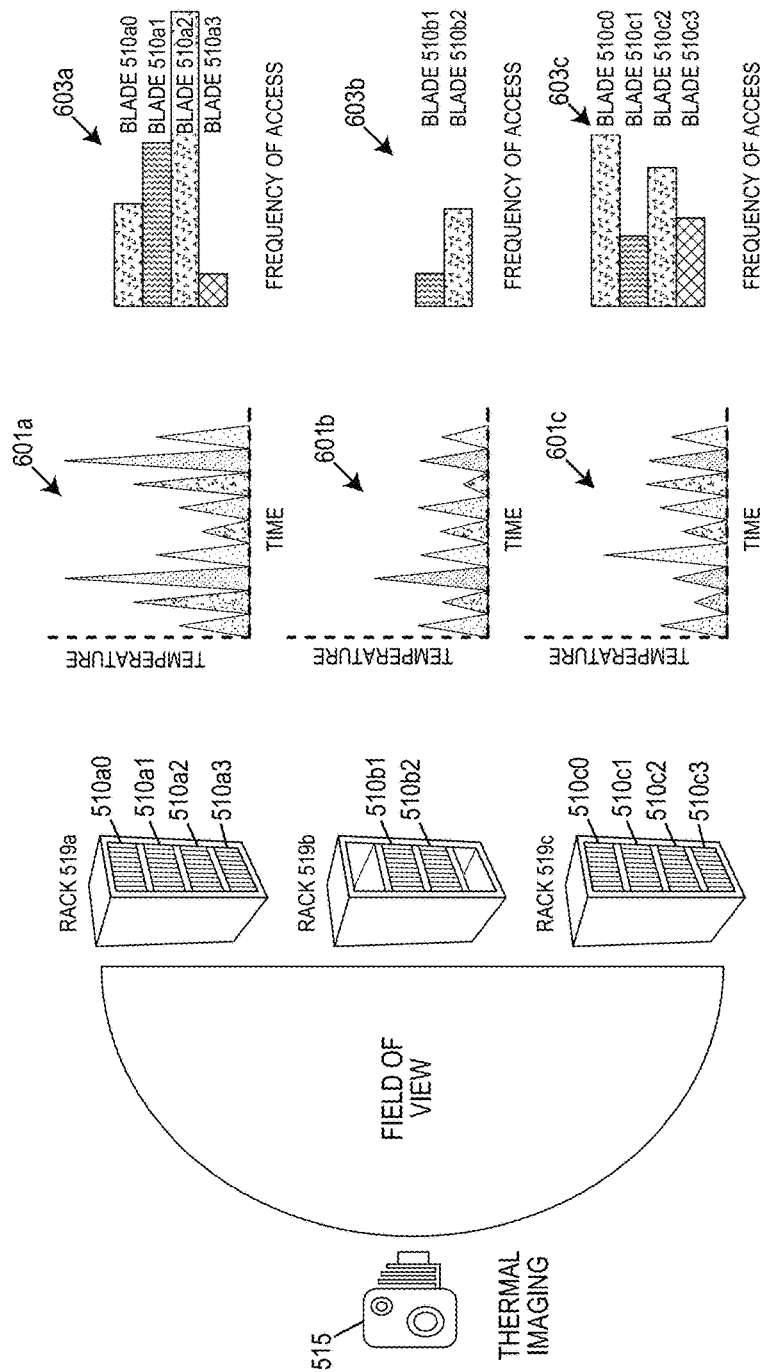
FIG. 6B illustrates an embodiment of an imaging system viewing, tracking and/or recording temperature readings and frequency of access of one or more hardware units of a datacenter, in accordance with the present disclosure.

Imaging system(s) 515 may refer to one or more devices capable of detecting measurable changes within the datacenter's hardware units and the environment surrounding the hardware units or the environment of the datacenter 600 itself by visually viewing the hardware unit(s) and the surrounding space. In exemplary embodiments of computing environment 500, an imaging system 515 may include a thermal imaging camera, thermal imaging device or other types of instruments that may be capable of viewing, measuring and/or collecting data describing an amount of heat (or temperature of the heat) given off by hardware units within the datacenter 600. As shown in FIGS. 6A-6B, embodiments of imaging system(s) 515 may be positioned throughout a datacenter 600 to capture thermal imaging data, including temperature information describing one or more hardware units. For example, thermal camera of an imaging system 515 may be assigned to capture thermal imaging data for plurality of hardware units, including thermal imaging data describing temperature information about a plurality of different server blades 510 positioned within one or more server racks 519. For instance, an imaging system, which may include a thermal camera may monitor 2, 3, 4, or more server racks at a time, with each server rack comprising a plurality of server blades 510a-510n.

Embodiments of the computing environment 500 of a datacenter 600 may include a plurality of sensors 517 positioned throughout the datacenter. Sensors 517 may be incorporated as part of the imaging system 515 or may be a separate device that is separate from the imaging system 515. Sensors 517 may be described as a device that detects or measures a physical property and records, indicates or otherwise responds to a physical stimulus, including heat, light, sound, pressure, magnetism, or motion. As heat is generated by one or more hardware units (and observed by the imaging system 515), sensors 517 positioned throughout the datacenter 600 may obtain information describing the heat exhausted by the one or more hardware units. In an exemplary embodiments sensors 517 may be a temperature sensor and may be capable of measuring temperature data at a specific location within the datacenter 600. Sensors 517 may record temperature readings of specific server blades 510 and/or server racks 519 within the datacenter 600 as well as the time the temperature reading was taken by the sensor 517. Embodiments of sensors 517 may report the collected temperature data measured by the sensors 517 to a temperature management system 501. Temperature readings recorded by the sensors 517 may be transmitted via the computer network 250 to the temperature management system 501 continuously via a continuous data stream and/or at configured intervals of time.

Cooling system 521 may refer to one or more components that can be responsible for primarily maintaining the temperature or climate within a datacenter 600 or the temperatures of individual hardware units of the datacenter 600, at a configured temperature target (referred to as a "target temperature"). The cooling system 521 can comprise a plurality of different components working together to decrease temperatures within the datacenter 600. For instance, the cooling system 521 can include (but is not limited to) components such as a computer room air handler (CRAH) 523, and a water control system 527. CRAH 523 may be described as a device used within the datacenter 600 that operates to remove or reduce heat produced by hardware units. A CRAH 523 may utilize fans, cooling coils and a water chiller to remove the excess heat. A water control system 527 may be used in conjunction with the CRAH 523 to control the flow of water through water pipes built below a subfloor of the datacenter 600 in order to deliver water through one or more cooling coils and blow cold air through the subfloor, cooling the hardware units within the datacenter 600. FIG. 6A depicts an example of a datacenter 600 configured with a cooling system 521 comprising a CRAH 523 and a water control system 527. As shown in FIG. 6A, water enters the datacenter 600 underneath the floor using a set of piping to direct the water released by the water control system 527 to cooling coils and/or water chiller to decrease the temperature of the incoming water by blowing air past the chilled water and pushing the cooled air into the main area of the datacenter where rows of server racks 519 are positioned. Alternatively, computing room air conditioning (CRAC) units may be used instead of or in combination with the CRAH 523. CRAC units may rely on the use of mechanical refrigeration to cool the air within a datacenter 600.

Embodiments of the computing environment 500 and/or datacenter 600 may further include a power distribution unit (PDU) 525. The PDU may be an electrical component that may distribute and manage a supply of electricity to computers, servers, networking devices or other hardware units that may be present within a datacenter 600 or networked with the datacenter 600. The PDU 525 may operate as a central control point for controlling and distributing electricity across the datacenter 600 to components, including server racks 519 and server blades 510. The PDU(s) 525 can be floor mounted or mounted directly to a server rack 519.

Temperature management system 501 may refer to a specialized type of computing system 100 connected to network 250 that may offer information, resources, services and/or applications to users or administrators of the datacenter 600, and/or nodes of the network 250 in order to manage temperatures of a datacenter 600. In the exemplary embodiment, the temperature management system may provide software, applications or services configured for maintaining, managing and/or controlling temperatures within a datacenter 600 in the event of a malfunction of one or more components of cooling system 521, or in the event that a cooling system 521 becomes inoperable or unable to continue cooling the data center in a manner that meets a target temperature configured for the datacenter 600. As shown, embodiments of the temperature management system 501 may comprise a temperature management module 505 performing one or more functions, tasks or processes associated with controlling and/or managing datacenter temperatures during a malfunction of a cooling system or period of inoperability. The term "module" may refer to a hardware module, software module, or a module may be a combination of hardware and software resources. A module (whether hardware, software or a combination thereof) may be designed to implement or execute one or more specific tasks, routines or functions. Embodiments of hardware-based modules may include self-contained components such as chipsets, specialized circuitry, one or more memory 105 devices and/or persistent storage 106. A software-based module may be part of a program 114, program code or linked to program code comprising a set of specific programmed instructions loaded into a memory 105 device or persistent storage 106 device. In the exemplary embodiment of computing environment 500, the temperature management module 505 may include one or more sub-modules 507, 509, 511, 513, which may be configured to performs specific tasks, functions or processes of the temperature management module 505. For example, a temperature management module 505 may include an imaging module 507, resource monitor 509, scoring module 511 and/or a power control module 513, however other variations and additional components or modules may be present within the temperature management module 505.

Figure 6C:
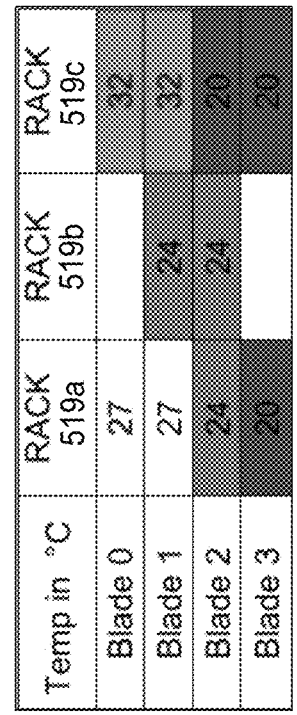
FIG. 6C depicts an embodiment of a heat map mapping temperature data describing a plurality of server racks, with each server rack comprising a plurality of server blades within the server rack, in accordance with the present disclosure.

Imaging module 507 may perform tasks, functions and/or processes of the temperature management module 505 associated with collecting thermal imaging data and temperature information from one or more thermal imaging systems 515 or sensors 517. Imaging module 507 may continuously observe and collect temperature information about the hardware units positioned within the datacenter 600 and/or the imaging module 507 may interpret or convert thermal images collected by thermal camera systems and output temperature readings describing heat be exhausted by each of hardware units within a datacenter 600 being monitored. Thermal imaging data and temperature information collected by the imaging module 507 can be marked and mapped to the corresponding hardware units within the datacenter 600. Thermal imaging data and temperature information can be identified as being output by specific hardware units, such as a specific server rack 519 or server blade 510. Imaging module 507 can generate a heat map of the temperature information to the corresponding server rack 519 and/or specific server blades 510*a*-510*n* outputting the heat observed by the imaging system 515 or measured by sensors 517. For example, FIG. 6C depicts an embodiment of a heat map that may be generated by an imaging module 507. As shown, the heat map can comprise readings from the imaging system 515 for a plurality of hardware units that may be monitored by a single thermal imaging camera or a combination of multiple thermal imaging cameras. For instance, in an exemplary embodiment depicted in FIGS. 6B-6C, a ratio of one thermal camera monitoring three server racks 519 may be configured. However, in other embodiments, one thermal camera may monitor a single server rack 519, two server racks 519 or a single thermal camera may monitor four or more server racks 519 at a time.

Thermal images taken by imaging system(s) 515 may describe the heat signature outputted for each server blade 510 and the measured temperature data can be mapped to a corresponding server rack 519*a*-519*c*. Imaging module 507 can assign a temperature corresponding to color coding depicted by the thermal image. Embodiments of the heat map may color code the temperatures within the heat map to specific temperatures or temperature ranges, which may correspond to the colors depicted by a thermal image collected by the imaging system 515. For example, as shown in a thermal image received by the imaging module 507, temperatures of hardware units registering a temperature in the range of 20-23 degrees Celsius may be depicted as a first color, 24-26 degrees Celsius may be a second color, 27-30 degrees Celsius may be shown as a third color, 31-33 degrees Celsius may be a fourth color while 34 degrees Celsius and higher may be a fifth color.

Embodiments of the imaging module 507 may also track changes in the heat being outputted by the plurality of hardware units within the datacenter 600 over time. As thermal imaging data and temperature information is collected or interpreted by the imaging module 507, the imaging module 507 can record and/or track changes in the temperatures over time and may further graph the temperature changes. For example, as shown in FIG. 6B, imaging module can construct temperature graphs 601a-601c describing temperature changes for each of the corresponding server racks 519a-519c over time, as well as track temperature changes for each of the individual server blades 510a0-510a3, 510b1-510b2, and 510c0-510c3 over time. The temperature graphs 601a-601c can track individual temperature changes to individual server blades 510 or the overall temperature of server racks 519, either in real time or in some configurations the temperature graphs 601a-601c can be updated at configured intervals of time. Thermal imaging data, temperature data and temperature graphs 601a-601c constructed from the data collected by the imaging module 507 may be stored to a storage device of the imaging module 507, the temperature management module 505, the temperature management system 501 and/or a storage device accessible to the computing network 250 of the computing environment 500.

Resource monitor 509 may be a component of the temperature management module 505 responsible for performing functions, tasks or processes associated with assessing the most frequently used and least used hardware units within a datacenter 600. The resource monitor 509 may be a network resource monitoring tool that can interface with each of the hardware units of the datacenter 600 and collect information about each hardware units' activity over a computer network 250. Information collected by resource monitor 509 can include information about the programs, applications and/or services that are being run by the hardware unit, how frequently users are accessing the programs, applications, or services provided by each hardware unit and the amount of traffic being routed to the hardware units over a computer network 250. Embodiments of the resource monitor 509 may track how frequently individual hardware units are accessed over a pre-determined interval of time (referred to herein as "frequency of access"). For example, the amount of network traffic or requests being received by each of the hardware units over a 1-hour period, over a 6-hour period, over a 12-hour period, over a 24-hour period, etc. Embodiments of resource monitor 50 can measure the frequency of access occurring over the selected interval of time at a hardware unit such as a server rack 519 or server blades thereof and may generate a frequency graph 603a-603b describing the frequency of access for each server rack 519a-519c and/or each server blade 510 corresponding to the server rack 519 upon which the server blade 510 is installed. For example, a frequency graph 603a representing frequency of access for each of the server blades 510a0-510a3 can be generated for server rack 519a, while frequency graph 603b tracks frequency access of server blades 510b1-510b2 installed to server rack 519b and frequency graph 603c tracks the frequency access of server blades 510c0-510c3 installed on server rack 519c.

In addition to monitoring the frequency at which each hardware unit is accessed, embodiments of the resource monitor 509 may further monitor hardware units of a datacenter 600 to determine a number of mission critical applications being hosted and deployed by individual hardware units. Resource monitor 509 may collect details and information describing programs and applications running on each hardware unit and identify from the number of programs or applications deployed, a number of mission critical applications that may be running on the hardware units at any given time or time period being examined by the resource monitor. Resource monitor 509 may track the number of mission critical applications running on each hardware unit of the datacenter 600, times of day mission critical applications may be deployed or offline, map mission critical applications to corresponding hardware units and store records of mission critical application deployment to one or more storage devices of the temperature management module 505, the temperature management system 501, or network nodes connected thereto.

Embodiments of the temperature management module 505 may further comprise a scoring module 511. The scoring module 511 may be responsible for performing functions, tasks and processes of the temperature management module 505 associated with generating a prioritization of hardware units within the datacenter 600 to be maintained and operational in the event that cooling system 521 becomes inoperable or malfunctions, resulting in temperatures within the datacenter 600 rising above a target temperature and one or more hardware units may need to be shutdown to reduce temperatures within the datacenter 600. The prioritization order of the hardware units being sequentially shutdown may be determined by the scoring module 511 using a scoring algorithm that may consider a plurality of inputs, including (but not limited to) recorded temperatures of the hardware units, the frequency of access for each of the hardware units, and a number of mission critical applications that are hosted by hardware units. Moreover, depending on the time of day the malfunction of the cooling system 521 occurs, the values of each input may change and impact a hardware unit's place in the prioritization order. For example, if server blades 510 of a server rack are known to have a reduced frequency accesses between the hours of 10 pm to 6 am, and a cooling system goes offline at 11:30 pm, the input into the scoring module may be considered based on the time of the cooling system 521 outage and therefore calculate prioritization order as of 11:30 pm. Likewise, over time, as the outage of the cooling system 521 continues, prioritization may be re-calculated and systems that may be higher ranked in the prioritization order previously can become lower priority and thus turned off, while hardware units that may have been previously turned off due to low prioritization at the time of shutdown may be turned back on as the hardware unit becomes higher priority at the current time of day.

Embodiments of the scoring module 511 may receive inputs for the scoring algorithm from the imaging module 507 and the resource monitor 509. For instance, imaging module 507 may provide the scoring module 511 with mappings of temperatures corresponding to each of the hardware units of the datacenter over a period of time, or continuously as a live stream of data. The resource monitor 509 may provide inputs to the scoring module 511 comprising frequency of access information for each of the hardware units being monitored and the number of mission critical applications being hosted by each of the hardware units. Using the inputs provided by the imaging module 507 and the resource monitor 509, scoring module 511 can calculate a weighted score assessing the risk of shutting down each of the hardware units during periods of cooling system 521 malfunction or inoperability. A weighting table 701 may be used by the scoring algorithm of the scoring module 511 to generate the weighted score, whereby various values or ranges of the inputted parameters provided by the imaging module 507 and/or the resource monitor 509 are assigned a weight for tallying a final score calculation.

FIG. 7A depicts an embodiment of a weighting table 701 that may be utilized by the scoring module 511 when calculating a weighted score and organizing the weighted scores assigned to hardware units as an ordered list or hierarchy for prioritizing sequential shutdowns of the hardware units. In the example of the weighting table 701 depicted in FIG. 7A, hardware units identified as having temperatures between 0-20° C. can be assigned a weight of 5 to the overall score, whereas hardware units operating at a measured temperature between 20-28° C. may be assigned a weight of 2 to the overall score and hardware units having a temperature measured above 28° C. can be assigned a weight to the overall score of 1. Likewise, the scoring module 511 may further assess weights based on the frequency of access and the number of mission critical applications hosted by each hardware unit of the datacenter. For instance, utilizing the weighting table 701 of FIG. 7A, a hardware unit being accessed 100 times within a defined period of time may be assigned a weight of 4, while a hardware unit being accessed 100-500 times within a defined period might be assigned a weight of 2 and a hardware unit being accessed more than 500 times may be assigned a weight of 1. Similarly, hardware units hosting 0 mission critical applications may be assigned a weight of 3, whereas hardware units having between 0-5 mission critical applications being hosted can be assigned a weight of 2 and hardware units hosting more than 5 mission critical application can be assigned a weight of 1. Although FIG. 7A depicts one example of weighting table having values assigned for each of the various inputs (i.e., temperature, frequency of access and mission critical applications hosted), the weighting table 701 can be configured for any type of inputs, corresponding weights and/or ranges and should not be limited to the only those inputs, ranges and weights depicted in FIG. 7A.

For each hardware unit being assessed and assigned weightings based on the inputs such as temperature, frequency of access and the number of mission critical applications hosted, the scoring module 511 may add together all of the weightings of the selected inputs and arrive at a total calculated score (i.e., a weighted score) for each hardware unit. Based on the total weighted score, the scoring module 511 can make a risk assessment for each of the hardware units based on a risk assessment classification table 703. In the example of the exemplary embodiment as shown in FIG. 7B, a hardware unit having a weighted score higher than 8 upon adding weights of the temperature, frequency of access and number of mission critical applications hosted, may be assigned a "low" risk assessment, whereas hardware units having a weighted score between 4-7 may be assigned a medium risk assessment and hardware units having a weighted score of less than 3 may be deemed to have a "high" risk assessment.

The scoring algorithm applied by the scoring module 511 may produce an ordered list or hierarchical list of outputs that can be used as part of a decision-making process during emergency situations wherein a cooling system 521 of the datacenter has become inoperable or malfunctions for a period of time in the event that the cooling system 521 malfunctions or becomes inoperable for a period of time, resulting in temperatures of the datacenter arising above a target temperature. The list of outputs may signify a sequential order or prioritized order for shutting down hardware units of the datacenter 600. Hardware units prioritized to be shutdown first may be placed at the top of the ordered list, while hardware units prioritized for being shut down last are positioned at the bottom of the ordered list, ensuring that during sequential shutdowns of hardware units to reduce the temperature of the datacenter 600, the hardware units considered the most important or having the highest risk assessment are shut down after the low risk and medium risk hardware units.

FIG. 7C provides an example of a scoring algorithm output table 705 generated by a scoring module 511 using the weighting table 701 of FIG. 7A. In the example depicted, rack 20 of a datacenter may comprise 4 server blades 510 referred to as R20B0 to R20B3. At time T1 a temperature for rack 20 blade 0 is identified by the imaging module 507 as being 32° C. If the frequency of access of R20B0 is 650 times within a selected time period and R20B0 hosts 6 mission critical applications, then the risk assessment of R20B0 can be calculated in accordance with the weighting table 701 as having a final weighted score of 3 (1+1+1). Final weighted scores can be calculated for each of the remaining server blades of server rack 20. In this example, as shown by FIG. 7C, R20B2 has a final weighted score of 9, R20B3 has a final weighted score of 7 and R20B1 has a final weighted score of 2. When prioritized in sequential order as shown by the scoring algorithm output table 705, the sequential order for shutting down the blades of the server rack 20 to lower a datacenter 600 temperature to below a target temperature may be in the order of R20B2 first, followed by R20B3, R20B0 and lastly R20B1. With the shutdown of each server blade 510 within the scoring algorithm output table 705, the temperature management module 505 may reassess the temperature of the datacenter 600 and proceed to sequentially shutdown the next hardware unit within the ordered list of the scoring algorithm output table 705 until a target temperature is achieved or the cooling system 521 becomes operational again.

Power control module 513 may perform functions, tasks and/or processes of the temperature management module 505 associated with the management of power being supplied to hardware units a datacenter 600 and may control the automated shutdown of one or more hardware units in the sequential order of the list provided by the scoring algorithm output table 705. Power control module 513 may send signals to power distribution unit 525 indicating one or more hardware units to shut down during an emergency situation where a cooling system 521 is offline, inoperable or malfunctioning. In response to the signals sent by the power control module 513, power distribution unit 525 may shutdown the hardware unit(s) as indicated by the power control module 513. In other embodiments, instead of turning off power at the power distribution unit 525 to shut down one or more hardware units, power control module 513 may sequentially send requests directly to the hardware units via network 250 in accordance with the order prescribed by the scoring module's sequentially ordered list of hardware units. For example, shutting down one or more server blades 510 at the server rack 519 rather than turning off power to the server blades at the power distribution unit 525.

Method for Managing Temperatures of a Datacenter

Figure 8:
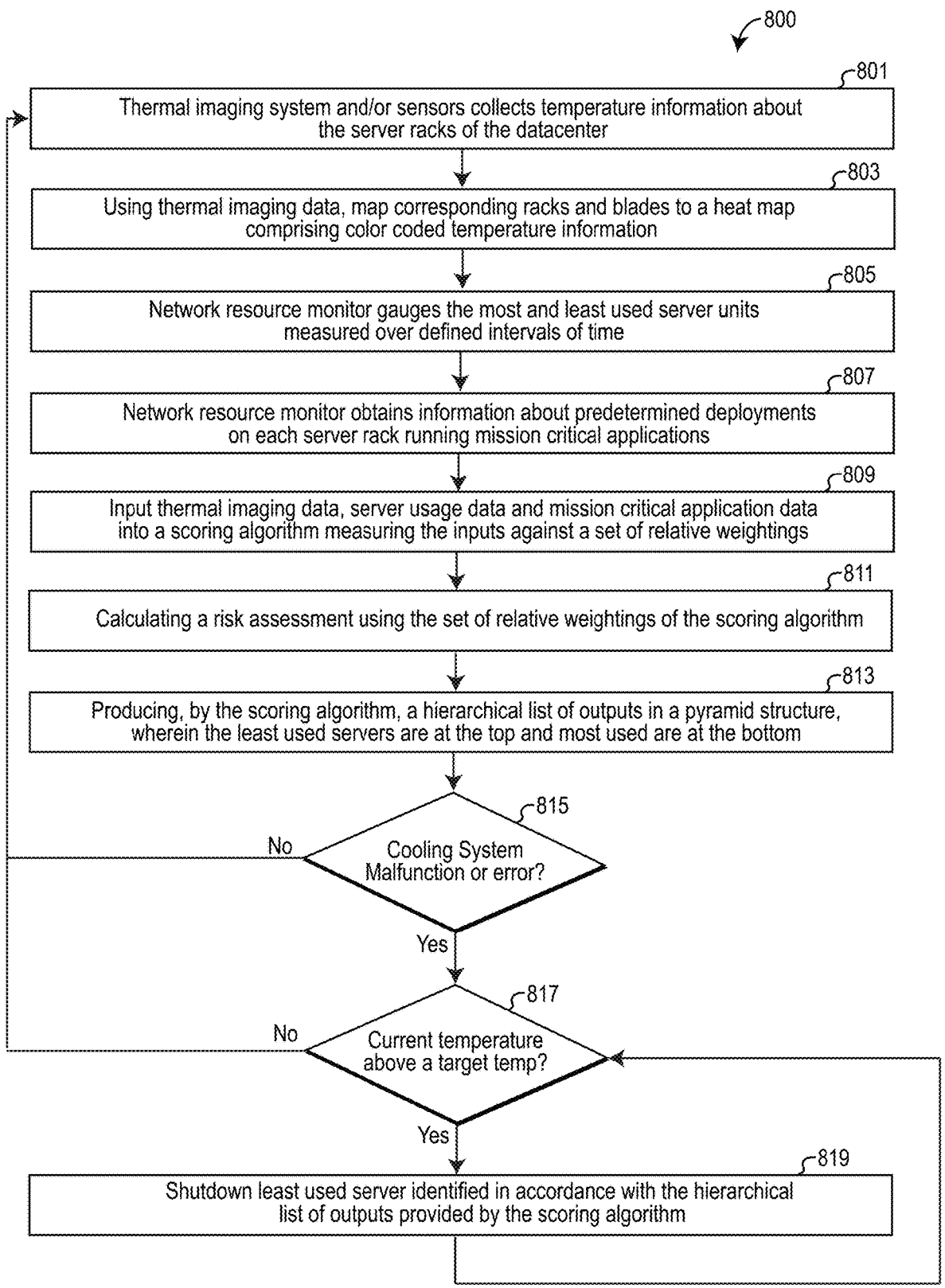
FIG. 8 depicts a flow diagram describing an embodiment of a method for managing temperatures of a datacenter experiencing a malfunctioning or inoperable cooling system, in accordance with the present disclosure.

The drawings of FIG. 8 represent embodiments of methods for managing temperatures of a datacenter during periods of time when a cooling system 521 is non-operational using one or more computing systems defined generically by computing system 100 of FIGS. 1-2; and more specifically by the embodiments of the specialized systems and/or computing environments depicted in FIGS. 3-7C and as described herein. A person skilled in the art should recognize that the steps of the method described in FIG. 8 may be performed in a different order than presented and may not require all the steps described herein to be performed.

The embodiment of method 800 described by FIG. 8 may begin at step 801. During step 801, a thermal imaging system or other type of imaging system 515 and/or sensors 517 may collect thermal imaging data and temperature information about hardware units of a datacenter 600. For example, thermal imaging data or temperature information about one or more server racks 519 and a plurality of server blades 510 that may be operating as part of the server rack 519. In step 803, using the thermal imaging data and temperature information collected in step 801, a heat map can be generated by mapping temperature data to corresponding hardware units observed by the imaging system(s) 515 to be emitting the heat captured as part of the thermal imaging data. The map can be color coded to the temperature information of the thermal images taken by the imaging system(s) 515.

In step 805, a resource monitor 509 of the network can gauge the most used and least used hardware units of the datacenter 600 over a defined period of time. Resource monitor 509 may observe and track the frequency at which each of the hardware units are accessed and store the frequency of access information for use by a scoring module 511. In step 807, the resource monitor 509 may obtain additional information about the hardware units of the datacenter 600, such as the predetermined number of deployments occurring on each of the hardware units that are running mission critical applications for the datacenter.

In step 809, the thermal imaging data and/or temperature information collected by imaging system 515 and/or sensors 517 can be inputted in to a scoring module 511, along data collected by a resource monitor 509 describing frequency of access by each hardware unit of the datacenter 600 and the number of mission critical applications being deployed by each hardware unit. In step 811, the scoring algorithm of the scoring module 511 receiving the inputs form the imaging module 507 and/or resource monitor 509 may calculate a risk assessment for each of the hardware units using a set of relative weighting of the scoring algorithm. In step 813, the scoring module 511 may produce an output from the scoring algorithm. The output from the scoring algorithm may be hierarchical output in the form of a pyramid structure or sequential listing of hardware units, prioritizing the least used hardware units or lowest risk hardware units at the top of the sequential order, while the most used hardware units or highest risk hardware units of the datacenter 600 may be positioned at the bottom of the sequential order of hardware units within the ordered list, or at the bottom of the pyramid structure within the hierarchical output of the scoring algorithm.

In step 815, a determination may be made whether or not a cooling system 521 of the datacenter is experiencing a malfunction, error or has become inoperable. If the cooling system 521 is not experiencing errors or malfunctions, is operational or otherwise functioning normally, the method 800 may proceed back to step 801 whereby imaging systems 515, sensors 517 and resource monitors 509 of the temperature management module 505 may continue to monitor hardware units and continually or occasionally reassess the risk of each hardware unit and/or revise the sequential order for potentially shutting down hardware units in the event of a malfunction or inoperability of the cooling system 521. Conversely, if in step 815 a determination is made by the temperature management system 501 that a cooling system 521 is malfunctioning, inoperable, experiencing one or more errors and/or is not otherwise operating normally, the method 800 may proceed to step 817. During step 817, a comparison can be made between the current temperature within a datacenter environment and a target temperature configured for the datacenter environment. If the current temperature is not above a target temperature, the method 800 may proceed back to step 801. However, in the circumstances where in the current temperature within a datacenter environment is above a configured target temperature, the method 800 may proceed to step 819. During step 819, the temperature management module 505 may begin sequentially shutting down hardware units in the order of the hierarchical list or sequentially ordered list generated in step 813, beginning with the least used hardware units and/or the hardware unit calculated as being the lowest risk for shutting down in accordance with the output of the scoring algorithm. Upon shutting down one or more hardware units in the order as prescribed by the scoring algorithm's output, the method may return to step 817 to further compare the current temperature with the target temperature. If the current temperature is still above the target temperature, and the cooling system 521 is still not operational, the method 800 may iteratively continue to shut down hardware units in the sequential order prescribed by the scoring algorithm until either the current temperature of the datacenter environment falls below the target temperature or the cooling system 521 become operational again.

What is claimed is:

1. A computer-implemented method for managing temperatures of a datacenter, the computer-implemented method comprising:

collecting, by a processor, thermal imaging data from at least one thermal imaging system monitoring temperatures of at least one hardware unit of the datacenter;

monitoring, by the processor, network resource of each of the at least one hardware unit for information indicating frequency of access for each of the at least one hardware unit over a selected period of time;

obtaining, by the processor, a number of deployments running on each of the at least one hardware unit that are mission applications;

calculating, by the processor, a weighted score for each of the at least one hardware unit based on a combination of the thermal imaging data, the frequency of access and the number of deployments that are mission applications;

ordering, by the processor, the weighted scores into a list from lowest risk assessment to highest risk assessment for the at least one hardware unit; and upon detecting, by the processor, the temperatures within the datacenter arising above a target temperature, automatically shutting down a hardware unit with the weighted score that indicates the lowest risk assessment on the list.

2. The computer-implemented method of claim 1, wherein the at least one hardware unit is a server rack comprising a plurality of server blades.

3. The computer-implemented method of claim 2, further comprising:

mapping, by the processor, the thermal imaging data corresponding to the server blades of the server rack to a heat map.

4. The computer-implemented method of claim 1, further comprising:
    detecting, by the processor, a malfunction of a cooling system responsible for an increase in the temperatures within the datacenter arising above the target temperature.

5. The computer-implemented method of claim 1, further comprising:
    sequentially shutting down, by the processor, each of the at least one hardware unit of the list in order from highest weighted score to lowest weighted score until the temperatures within the datacenter are measured to be below the target temperature.

6. The computer-implemented method of claim 2, wherein the weighted score for each of the at least one hardware unit based on a combination of the thermal imaging data, the frequency of access and the number of deployments that are mission applications is calculated for each of the server blades of the server rack.

7. The computer-implemented method of claim 4, wherein the malfunction of the cooling system triggers a calculation of the weighted score for each of the hardware units based on a combination of the thermal imaging data, the frequency of access and the number of deployments that are mission critical applications and the shutting down of the hardware unit with a highest weighted score on the list.

8. A computer system for managing temperatures of a datacenter comprising:
    a processor;
    at least one thermal imaging system placed in communication with the processor;
    at least one hardware unit positioned within the datacenter and is observable by the at least one thermal imaging system; and
    a computer-readable storage media coupled to the processor, wherein the computer-readable storage media contains program instructions executing, via the processor, a computer-implemented method comprising:
        collecting, by the processor, thermal imaging data from the at least one thermal imaging system monitoring temperatures of at least one hardware unit of the datacenter;
        monitoring, by the processor, network resource of each of the at least one hardware unit for information indicating frequency of access for each of the at least one hardware unit over a selected period of time;
        obtaining, by the processor, a number of deployments running on each of the at least one hardware unit that are mission applications;
        calculating, by the processor, a weighted score for each of the at least one hardware unit based on a combination of the thermal imaging data, the frequency of access and the number of deployments that are mission applications;
        ordering, by the processor, the weighted scores into a list from lowest risk assessment to highest risk assessment for the at least one hardware unit; and
        upon detecting, by the processor, the temperatures within the datacenter arising above a target temperature, automatically shutting down a hardware unit with the weighted score that indicates the lowest risk assessment on the list.

9. The computer system of claim 8, wherein the at least one hardware unit is a server rack comprising a plurality of server blades.

10. The computer system of claim 9, further comprising:
    mapping, by the processor, the thermal imaging data corresponding to the server blades of the server rack to a heat map.

11. The computer system of claim 8, further comprising:
    detecting, by the processor, a malfunction of a cooling system responsible for an increase in the temperatures within the datacenter arising above the target temperature.

12. The computer system of claim 8, further comprising:
    sequentially shutting down, by the processor, each of the at least one hardware unit of the list in order from highest weighted score to lowest weighted score until the temperatures within the datacenter are measured to be below the target temperature.

13. The computer system of claim 9, wherein the weighted score for each of the at least one hardware unit based on a combination of the thermal imaging data, the frequency of access and the number of deployments that are mission applications is calculated for each of the server blades of the server rack.

14. The computer system of claim 11, wherein the malfunction of the cooling system triggers a calculation of the weighted score for each of the hardware units based on a combination of the thermal imaging data, the frequency of access and the number of deployments that are mission applications and the shutting down of the hardware unit with a highest weighted score on the list.

15. A computer program product for managing temperatures of a datacenter comprising:
    one or more computer readable storage media having computer-readable program instructions stored on the one or more computer readable storage media, said program instructions executes a computer-implemented method comprising:
        collecting, by a processor, thermal imaging data from at least one thermal imaging system monitoring temperatures of at least one hardware unit of the datacenter;
        monitoring, by the processor, network resource of each of the at least one hardware unit for information indicating frequency of access for each of the at least one hardware unit over a selected period of time;
        obtaining, by the processor, a number of deployments running on each of the at least one hardware unit that are mission applications;
        calculating, by the processor, a weighted score for each of the at least one hardware unit based on a combination of the thermal imaging data, the frequency of access and the number of deployments that are mission applications;
        ordering, by the processor, the weighted scores into a list from lowest risk assessment to highest risk assessment for the at least one hardware unit; and
        upon detecting, by the processor, the temperatures within the datacenter arising above a target temperature, automatically shutting down a hardware unit with the weighted score that indicates the lowest risk assessment on the list.

16. The computer program product of claim 15, wherein the at least one hardware unit is a server rack comprising a plurality of server blades.

17. The computer program product of claim 16, further comprising:
    mapping, by the processor, the thermal imaging data corresponding to the server blades of the server rack to a heat map.

18. The computer program product of claim 15, further comprising:
   detecting, by the processor, a malfunction of a cooling system responsible for an increase in the temperatures within the datacenter arising above the target temperature.

19. The computer program product of claim 15, further comprising:
   sequentially shutting down, by the processor, each of the at least one hardware unit of the list in order from highest weighted score to lowest weighted score until the temperatures within the datacenter are measured to be below the target temperature.

20. The computer program product of claim 16, wherein the weighted score for each of the at least one hardware unit based on a combination of the thermal imaging data, the frequency of access and the number of deployments that are mission applications is calculated for each of the server blades of the server rack.

\* \* \* \* \*